(12) United States Patent
Brockmeier et al.

(10) Patent No.: US 11,939,216 B2
(45) Date of Patent: Mar. 26, 2024

(54) METHOD WITH STEALTH DICING PROCESS FOR FABRICATING MEMS SEMICONDUCTOR CHIPS

(71) Applicant: Infineon Technologies AG, Neubiberg (DE)

(72) Inventors: Andre Brockmeier, Villach (AT); Stephan Helbig, Regensburg (DE); Adolf Koller, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 466 days.

(21) Appl. No.: 17/188,082

(22) Filed: Mar. 1, 2021

(65) Prior Publication Data

US 2021/0309513 A1    Oct. 7, 2021

(30) Foreign Application Priority Data

Apr. 2, 2020  (DE) .......................... 102020109149.4

(51) Int. Cl.
*B81C 1/00* (2006.01)
*G02B 26/08* (2006.01)
*G02B 26/10* (2006.01)

(52) U.S. Cl.
CPC ...... *B81C 1/00904* (2013.01); *B81C 1/00888* (2013.01); *G02B 26/0833* (2013.01); (Continued)

(58) Field of Classification Search
CPC ............ B81C 1/00888; B81C 1/00904; B81C 1/00436; B81C 1/00523; (Continued)

(56) References Cited

U.S. PATENT DOCUMENTS 8,809,166 B2    8/2014  Buenning et al.
9,040,389 B2 *  5/2015  Mackh ............... H01L 21/6836
                                                        438/458
(Continued)

FOREIGN PATENT DOCUMENTS

CN          103887156 A        6/2014
CN          105810644 A        7/2016
(Continued)

OTHER PUBLICATIONS

D. I. Cereno and S. Wickramanayaka, "Stealth Dicing Challenges for MEMS Wafer Applications," 2017 IEEE 67th Electronic Components and Technology Conference (ECTC), Orlando, FL, 2017, pp. 358-363, doi: 10.1109/ECTC.2017.132.
(Continued)

*Primary Examiner* — Jose R Diaz
(74) *Attorney, Agent, or Firm* — Harrity & Harrity, LLP

(57) ABSTRACT

A method includes producing a semiconductor wafer. The semiconductor wafer includes a plurality of microelectromechanical system (MEMS) semiconductor chips, wherein the MEMS semiconductor chips have MEMS structures arranged at a first main surface of the semiconductor wafer, a first semiconductor material layer arranged at the first main surface, and a second semiconductor material layer arranged under the first semiconductor material layer, wherein a doping of the first semiconductor material layer is greater than a doping of the second semiconductor material layer. The method further includes removing the first semiconductor material layer in a region between adjacent MEMS semiconductor chips. The method further includes applying a stealth dicing process from the first main surface of the semiconductor wafer and between the adjacent MEMS semiconductor chips.

14 Claims, 5 Drawing Sheets

(52) U.S. Cl.
CPC ...... *G02B 26/105* (2013.01); *B81B 2201/042* (2013.01); *B81C 2201/0132* (2013.01); *B81C 2201/0133* (2013.01); *B81C 2201/0143* (2013.01)

(58) Field of Classification Search
CPC .... B81C 2201/0132; B81C 2201/0133; B81C 2201/0143; G02B 26/0833; G02B 26/105; B81B 2201/0143; B81B 2201/042; B81B 2203/053; B81B 7/02
See application file for complete search history.

(56) References Cited

U.S. PATENT DOCUMENTS

| | | | | |
|---|---|---|---|---|
| 11,538,718 | B2* | 12/2022 | Colin | .............. H01L 21/78 |
| 2002/0041455 | A1 | 4/2002 | Sawada et al. | |
| 2012/0074565 | A1 | 3/2012 | Koroku | |
| 2014/0217577 | A1 | 8/2014 | Mackh | |
| 2015/0123264 | A1 | 5/2015 | Napetschnig et al. | |
| 2016/0211227 | A1 | 7/2016 | Wagner et al. | |
| 2018/0154361 | A1 | 6/2018 | Foster et al. | |
| 2018/0233410 | A1 | 8/2018 | James et al. | |
| 2018/0257927 | A1 | 9/2018 | Rothberg et al. | |
| 2018/0345418 | A1* | 12/2018 | Lei | .............. B23K 26/0624 |
| 2019/0181045 | A1 | 6/2019 | Lu et al. | |

FOREIGN PATENT DOCUMENTS

| | | |
|---|---|---|
| CN | 106981553 A | 7/2017 |
| FR | 3075773 A1 | 6/2019 |
| JP | 2010074136 A | 4/2010 |
| WO | 2019122641 A1 | 6/2019 |

OTHER PUBLICATIONS

Haiou L., et al., "Research Progress on Wafer Laser Cutting Technology," Semiconductor Technology, 2017, vol. 42 (8), pp. 561-568.

* cited by examiner

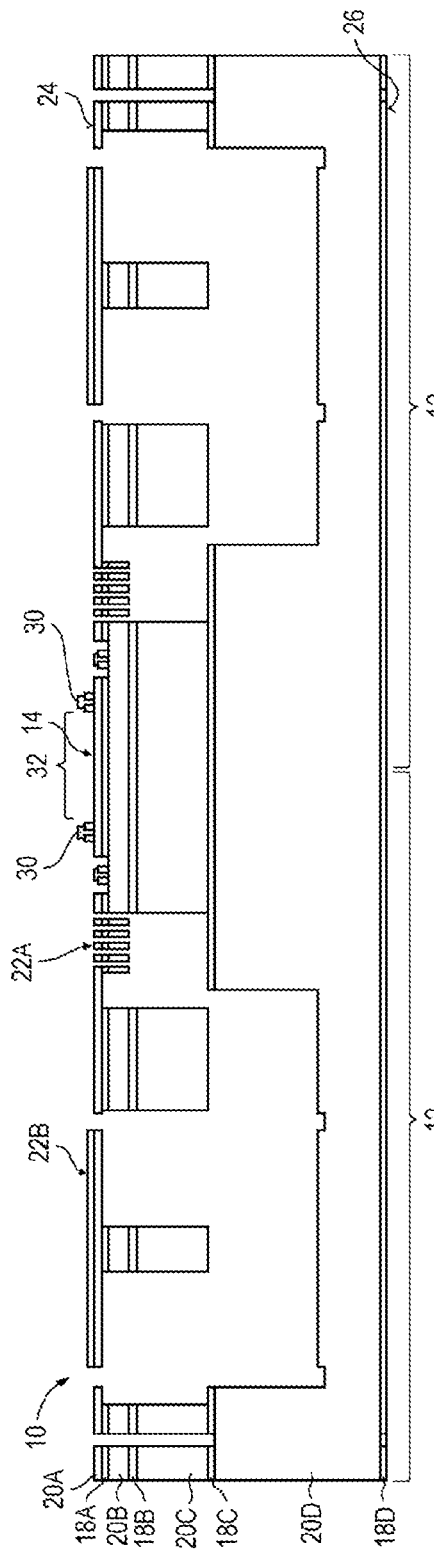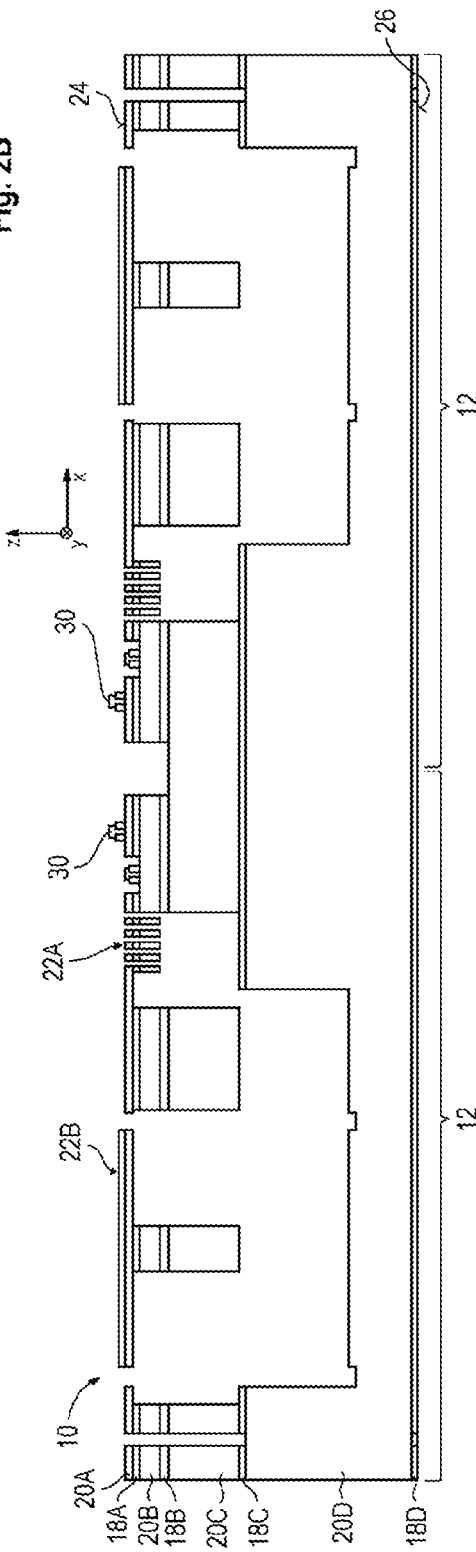

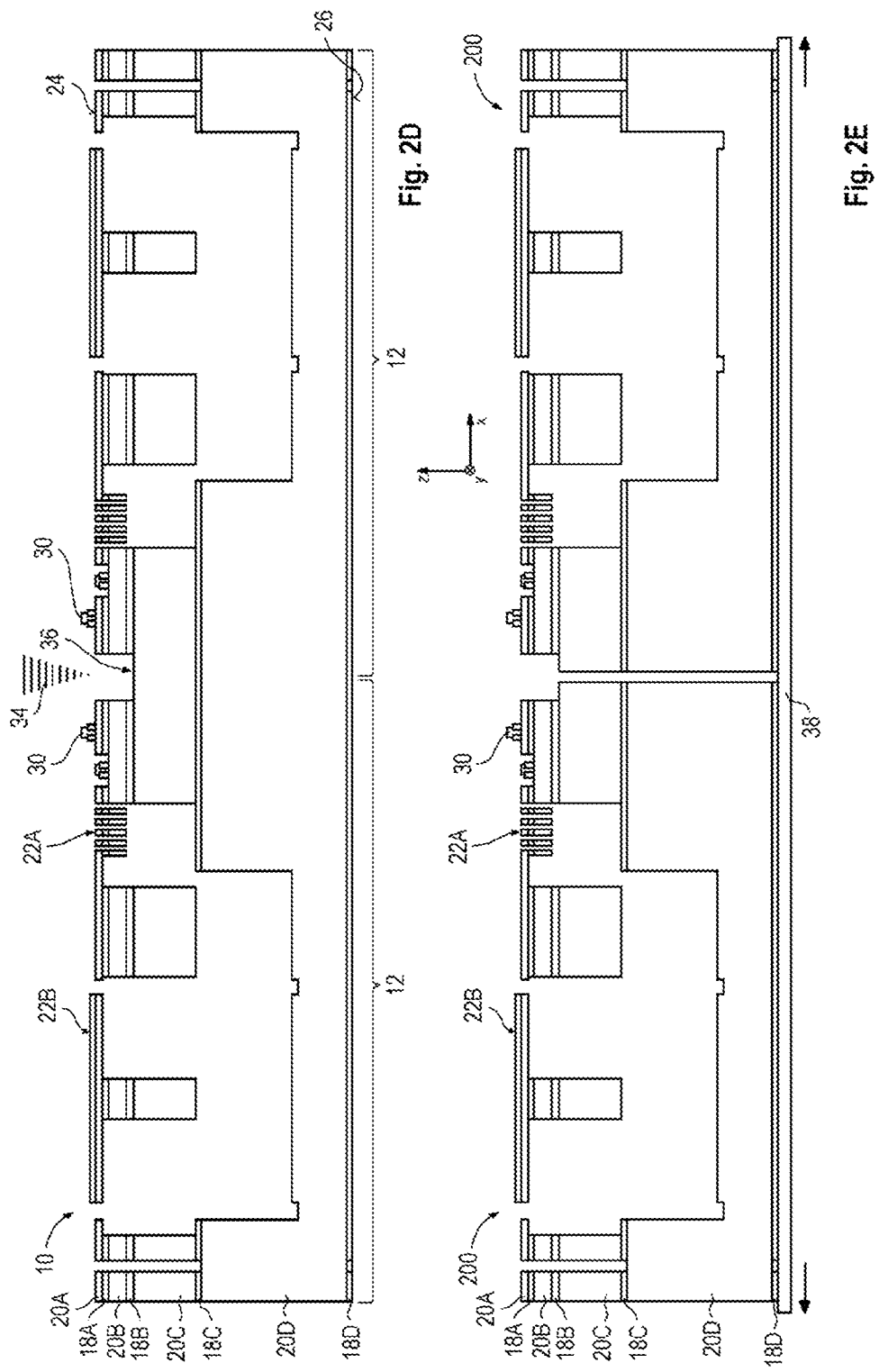

METHOD WITH STEALTH DICING PROCESS FOR FABRICATING MEMS SEMICONDUCTOR CHIPS

RELATED APPLICATION

This application claims priority to German Patent Application No. 102020109149.4, filed on Apr. 2, 2020, which is incorporated herein by reference in its entirety.

FIELD

The present disclosure relates to methods with stealth dicing processes for fabricating microelectromechanical system (MEMS) semiconductor chips. Furthermore, the disclosure relates to MEMS semiconductor chips fabricated by such methods.

BACKGROUND

Microelectromechanical system (MEMS) semiconductor chips can be fabricated at the wafer level, wherein the wafer is singulated into a plurality of MEMS semiconductor chips after the MEMS structures have been formed. The MEMS structures can comprise inter alia sensitive, open structures, such as movable micromirrors, for example. During singulation by means of mechanical dicing processes there is the risk of the sensitive MEMS structures being damaged. By way of example, the MEMS structures may incur damage as a result of vibrations of a saw blade used, cooling using water or particle contamination caused by sawing slurry. Manufacturers of MEMS semiconductor chips constantly endeavor to improve their products. In particular, it may be desirable here to provide methods for fabricating MEMS semiconductor chips in which the sensitive MEMS structures are not damaged and which can be used for different substrate dopings and substrate thicknesses.

SUMMARY

Various aspects relate to a method. The method includes producing a semiconductor wafer. The semiconductor wafer includes a plurality of microelectromechanical system (MEMS) semiconductor chips, wherein the MEMS semiconductor chips have MEMS structures arranged at a first main surface of the semiconductor wafer, a first semiconductor material layer arranged at the first main surface, and a second semiconductor material layer arranged under the first semiconductor material layer, wherein a doping of the first semiconductor material layer is greater than a doping of the second semiconductor material layer. The method furthermore includes removing the first semiconductor material layer in a region between adjacent MEMS semiconductor chips. The method furthermore includes applying a stealth dicing process from the first main surface of the semiconductor wafer and between the adjacent MEMS semiconductor chips.

Various aspects relate to a MEMS semiconductor chip. The MEMS semiconductor chip includes a MEMS structure arranged at a first main surface of the MEMS semiconductor chip. The MEMS semiconductor chip furthermore includes a first semiconductor material layer arranged at the first main surface. The MEMS semiconductor chip furthermore includes a second semiconductor material layer arranged under the first semiconductor material layer, wherein a doping of the first semiconductor material layer is greater than a doping of the second semiconductor material layer. The MEMS semiconductor chip furthermore includes a step formed between the first semiconductor material layer and the second semiconductor material layer at a sidewall of the MEMS semiconductor chip.

BRIEF DESCRIPTION OF THE DRAWINGS

Methods and devices in accordance with the disclosure are explained in greater detail below with reference to drawings. The elements shown in the drawings are not necessarily rendered in a manner true to scale relative to one another. Identical reference signs may designate identical components.

FIGS. 2A to 2E schematically show a method for fabricating microelectromechanical system (MEMS) semiconductor chips in accordance with one or more embodiments.

DETAILED DESCRIPTION

Figure 1:
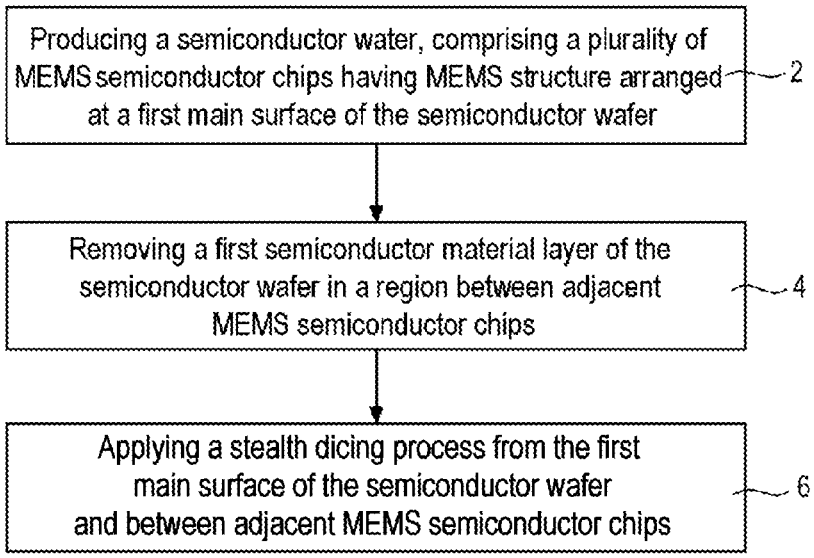
FIG. 1 shows a flow diagram of a method in accordance with the disclosure.

The method in FIG. 1 is illustrated in a general way in order to describe aspects of the disclosure qualitatively. The method can have further aspects, not shown and described in FIG. 1 for the sake of simplicity. The method can be extended by one or more aspects described in connection with other examples in accordance with the disclosure. By way of example, the method can be extended by one or more of the aspects described in connection with the method in FIGS. 2A-2E.

At 2 a semiconductor wafer can be produced. The semiconductor wafer can comprise a plurality of microelectromechanical system (MEMS) semiconductor chips, wherein the MEMS semiconductor chips have MEMS structures arranged at a first main surface of the semiconductor wafer. Furthermore, the semiconductor wafer can comprise a first semiconductor material layer arranged at the first main surface and a second semiconductor material layer arranged under the first semiconductor material layer, wherein a doping of the first semiconductor material layer is greater than a doping of the second semiconductor material layer. At 4 the first semiconductor material layer can be removed in a region between adjacent MEMS semiconductor chips. At 6 a stealth dicing process can be applied from the first main surface of the semiconductor wafer and between the adjacent MEMS semiconductor chips.

Figure 2A:
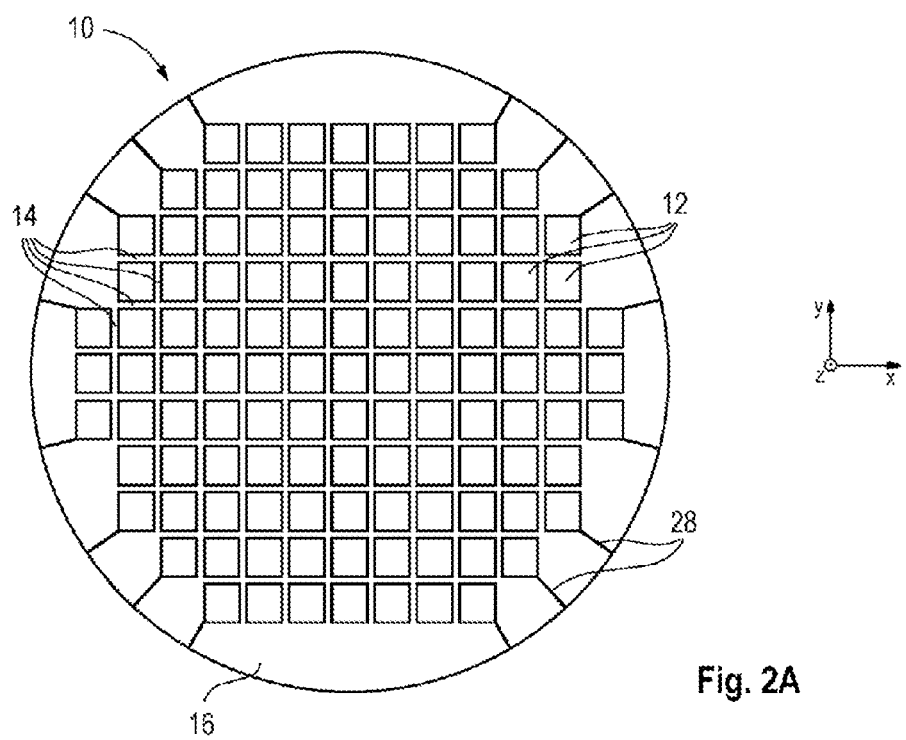

The method in FIG. 2A can be regarded as a more detailed explanation of the method in FIG. 1. In the plan view in FIG. 2A, a semiconductor wafer 10 can be provided, which can be manufactured from any desired semiconductor material, in particular silicon. The semiconductor wafer 10 can have a plurality of semiconductor chips (or semiconductor dies) 12, wherein the number of semiconductor chips 12 can be several dozens or several hundreds. A detailed structure of the semiconductor chips 12 is not shown in the plan view in FIG. 2A for the sake of simplicity. In the example in FIG. 2A, the semiconductor wafer 10 can be embodied in a circular fashion. In further examples, the semiconductor wafer 10 can correspond to a semiconductor panel and have a rectangular shape. On the surface of the semiconductor wafer 10 shown, it is possible to form regions 14 between the semiconductor chips 12 along which the semiconductor wafer 10 can be singulated into the semiconductor chips 12 in a later method step. The regions 14 between the semiconductor chips 12 can be referred to as scribe lines. In FIG. 2A, the scribe lines 14 can form a rectangular grid structure, for example.

A thickness of the semiconductor wafer 10 in the z-direction can be greater than approximately 600 micrometers, more precisely greater than approximately 650 micrometers, more precisely greater than approximately 700 micrometers, more precisely greater than approximately 750 micrometers, more precisely greater than approximately 800 micrometers, more precisely greater than approximately 850 micrometers, and even more precisely greater than approximately 900 micrometers. A width of the scribe lines 14 (kerf width) of the semiconductor wafer 10 can be less than approximately 240 micrometers, more precisely less than approximately 200 micrometers, and even more precisely less than approximately 160 micrometers. A ratio of a kerf width of the semiconductor wafer 10 to a thickness of the semiconductor wafer 10 in the z-direction can be less than approximately 0.4, more precisely less than approximately 0.3, and even more precisely less than approximately 0.2. In one specific example, therefore, given a ratio of the kerf width to the wafer thickness of approximately 0.1, a minimum kerf width of approximately 90 micrometers can result for a wafer thickness of approximately 900 micrometers.

The semiconductor wafer 10 can have an edge region 16, in which no semiconductor chips 12 and thus no scribe lines 14 can be formed. The edge region 16 can be excluded, or not excluded, from a later stealth dicing process. In the example in FIG. 2A, lines indicating the course of predetermined (or foreseeable) break lines 28 of the edges of the semiconductor wafer 10 are illustrated in the edge region 16. In other words, the break lines 28 can correspond to courses at which the semiconductor wafer 10 will be expected to break into the semiconductor chips 12 during later singulation. The number and position of the break lines 28 can be substantially known already before the singulation process. By way of example, the properties of the break lines 28 can be identified on the basis of one or more of a modeling, an analytical calculation or break lines occurring during singulation of similar semiconductor wafers. FIG. 2A shows exemplary break lines 28 which can indicate how the semiconductor wafer 10 will be expected to break in its edge region 16 if the edge region 16 remains (substantially) unprocessed. The break lines 28 in FIG. 2A can extend here (substantially) along a shortest distance between the respective semiconductor chip 12 and the outer edge of the semiconductor wafer 10.

An internal construction of the semiconductor wafer 10 is shown qualitatively in the cross-section side view in FIG. 2B. The semiconductor wafer 10 can for example be manufactured on the basis of an SOI (Silicon on Substrate) technology and be constructed here from a plurality of insulation layers (or dielectric layers) 18A-18D and semiconductor material layers 20A-20D arranged one above another. A thickness of the insulation layers 18A-18D in the z-direction can be in each case in a range of approximately 400 nanometers to approximately 600 nanometers, wherein a typical value can be approximately 500 nanometers, for example.

The semiconductor material layers 20A-20D can have different dopings. The semiconductor material layer 20A arranged at the upper main surface or front side 24 of the semiconductor wafer 10 and the semiconductor material layer 20B arranged underneath can be referred to as highly doped layers. Device structures, such as MEMS structures, for example, can be formed in the highly doped layers 20A, 20B. The highly doped layers can thus also be referred to as device layers. The highly doped layers 20A, 20B can provide the function of sensing, inter alia, in a MEMS semiconductor chip. In this case, tiny deflections of the movable MEMS structures can be detected capacitively with the aid of low voltages and/or low currents and be processed further. The insulation layers 18A, 18B arranged between or at the highly doped layers 20A, 20B can serve, inter alia, to be able to differentiate corresponding signal paths.

An electrical resistivity of the highly doped layers 20A, 20B can be in each case less than approximately 0.01 Ω·cm, more precisely less than approximately 0.005 Ω·cm, and even more precisely less than approximately 0.001 Ω·cm. A thickness of the semiconductor material layer 20A can be in a range of approximately 5 micrometers to approximately 15 micrometers, wherein a typical value can be 10 micrometers, for example. A thickness of the semiconductor material layer 20B can be in a range of approximately 30 micrometers to approximately 60 micrometers, wherein a typical value can be approximately 45 micrometers, for example. Two highly doped semiconductor material layers 20A, 20B are shown in the example in FIG. 2B. In further examples, the semiconductor wafer 10 can have just one highly doped semiconductor material layer.

The semiconductor material layers 20C, 20D arranged under the highly doped semiconductor material layers 20A, 20B can be referred to as lightly doped layers. An electrical resistivity of these layers can be in each case greater than approximately 0.1 Ω·cm, more precisely greater than approximately 0.5 Ω·cm, and even more precisely greater than approximately 1.0 Ω·cm. In particular, a doping of the highly doped semiconductor material layers 20A, 20B can thus be in each case greater than a doping of the lightly doped semiconductor material layers 20C, 20D. A thickness of the semiconductor material layer 20C can be in a range of approximately 150 micrometers to approximately 350 micrometers, wherein a typical value can be 250 micrometers, for example. A thickness of the semiconductor material layer 20D can be in a range of approximately 400 micrometers to approximately 800 micrometers, wherein a typical value can be approximately 600 micrometers, for example.

Only two semiconductor chips 12 of the semiconductor wafer 10 are shown in FIG. 2B for the sake of simplicity. Each semiconductor chip 12 can have one or more MEMS structures 22A, 22B, which can be integrated into the semiconductor chip 12. The semiconductor chips 12 that are singulated later can thus also be referred to as MEMS semiconductor chips or MEMS components. Very generally, the MEMS structures 22A, 22B of the semiconductor chips 12 can be arbitrarily micromechanical structures, such as, for instance, bridges, membranes, cantilevers, spring beams, tongue structures, comb structures, movable micromirrors, etc.

In the example in FIG. 2B, each semiconductor chip 12 can have two MEMS structures 22A, 22B, which can be arranged at the front side 24 of the semiconductor wafer 10. The lower main surface or rear side 26 of the semiconductor wafer 10 can be closed in a continuous fashion, i.e. the MEMS structures 22A, 22B can be accessible only via the front side 24 of the semiconductor wafer 10. The MEMS structure 22A can be a capacitive comb structure, for example, and the MEMS structure 22B can be a movable micromirror. In one example, the MEMS components to be fabricated from the semiconductor wafer 10 can be LIDAR (Light Detection and Ranging) (sensor components), such as can be used for example in fully autonomous or partly autonomous self-driving automobiles. In this case, the movable MEMS micromirror 22B can be designed to oscillate about a scanning axis, such that light which is reflected from the MEMS micromirror 22B and used for scanning the surroundings oscillates back and forth.

Metal structures 30 can be arranged on the front side 24 of the semiconductor wafer 10, which metal structures can be electrical contacts of the semiconductor chips 12, for example. Between adjacent semiconductor chips 12 or between the metal structures 30 of adjacent semiconductor chips 12, it is possible to form metal-free regions 32 on the front side 24 of the semiconductor wafer 10. The scribe lines 14 situated between the semiconductor chips 12 can be arranged in each case within the metal-free regions 32. In this case, a ratio of the dimension of the metal-free region 32 between the adjacent MEMS semiconductor chips 12 in the x-direction to a kerf width of the semiconductor wafer 10 can be greater than approximately 3.5, more precisely greater than approximately 4.0, more precisely greater than approximately 4.5.

In FIG. 2C, it is possible to selectively remove one or more of the semiconductor material layers 20A, 20B and insulation layers 18A, 18B in a region between the (directly) adjacent semiconductor chips 12. The layers can be removed successively from top to bottom in the z-direction beginning at the front side 24 of the semiconductor wafer 10. In this case, at least the first semiconductor material layer 20A or parts thereof can be removed. In the specific example in FIG. 2C, both the semiconductor material layers 20A, 20B and the insulation layers 18A, 18B can be removed, with the result that the top side of the underlying lightly doped semiconductor material layer 20C can be exposed.

Removing the one or more layers can comprise one or more of dry etching or wet-chemical etching. Dry etching can comprise plasma etching, in particular. In some examples, one of the insulation layers 18A, 18B can be designed as an etch stop layer. In further examples, one or both of the insulation layers 18A, 18B can be removed. Parameters of the etching process respectively employed can be adapted depending on the materials to be etched. By way of example, the process gas used when etching the semiconductor material layers 20A, 20B can be different than the process gas used when etching the insulation layers 18A, 18B.

The MEMS structures 22A, 22B can be formed by structuring the first highly doped semiconductor material layer 20A and/or the second highly doped semiconductor material layer 20B. In FIG. 2C, by way of example, the movable micromirror 22B can be formed from the first highly doped semiconductor material layer 20A and the capacitive comb structure 22A can be formed from both highly doped semiconductor material layers 20A, 20B. In one example, the MEMS structures 22A, 22B can already be formed before a process of removing the layers between the adjacent semiconductor chips 12 and can thus already be present in FIG. 2B. In a further example, forming the MEMS structures 22A, 22B and removing the layers between the adjacent semiconductor chips 12 can be carried out simultaneously by means of an identical process technique. That is to say that the MEMS structures 22A, 22B can be formed for example by means of the etching processes described above. In this case, the MEMS structures 22A, 22B would not yet have been formed or be discernible in FIG. 2B, but rather only in the course of the process step in FIG. 2C.

As already described above, the semiconductor wafer 10 can break along break lines in the edge region 16 during singulation. In accordance with one aspect of the disclosure, at least the first highly doped semiconductor material layer 20A and (optionally) one or more of the underlying layers can be removed in the edge region 16 along courses along which the edge region 16 is intended to break later. This makes it possible to avoid uncontrolled breaking of the semiconductor wafer 10 in the edge region 16 during a later singulation process. In one example, the highly doped layers can be removed in the edge region 16 along a continued course of one or more of the scribe lines 14, i.e. along the x-direction and/or along the y-direction in the present example. The courses of the removed highly doped layers in the edge region 16 can deviate in this respect from the break lines 28 illustrated in FIG. 2A. In one example, it is possible to remove the semiconductor material layer 20A (and possibly underlying layers) in the edge region 16 already before a process of removing the layers between the semiconductor chips 12. In a further example, removing the semiconductor material layer 20A (and possibly underlying layers) in the edge region 16 and also between the adjacent MEMS semiconductor chips 12 can be carried out simultaneously by means of an identical process technique.

In FIG. 2D, it is possible to apply a dry laser process, such as a stealth dicing process, for example, from the front side 24 of the semiconductor wafer 10 and between the adjacent MEMS semiconductor chips 12. In this case, a laser can be arranged above the front side 24 and a laser beam 34 or laser radiation provided by the laser can be focused onto a point in the interior of the semiconductor wafer 10. In this case, a wavelength of the laser radiation can be, in particular, in the infrared range, more precisely in the near infrared range, even more precisely in a range of approximately 1064 nanometers to approximately 1500 nanometers, and even more precisely in a range of approximately 1064 nanometers to approximately 1360 nanometers. By way of example, a pulsed Nd:YAG laser can be used. In one example, a wavelength (approximately 1064 nanometers) of the laser can be adapted to an electronic band gap (approximately 1.11 eV or approximately 1117 nanometers) of silicon, with the result that an absorption maximum can be set well by means of optical focusing. In this case, a frequency of the laser can be for example approximately 80 kHz (300 mm/s). In a further example, a wavelength of the laser can be approximately 1342 nanometers. In this case, a frequency of the laser can be approximately 160 kHz (600 mm/s) for example. In order that the laser beam 34 can couple adequately into the material of the semiconductor wafer 10, the material must be transparent to radiation in the wavelength ranges mentioned. Furthermore, the front side 24 of the semiconductor wafer 10 should have a smooth surface at the corresponding coupling-in location. In this context, the method in FIG. 2A-2E can optionally have one or more steps making it possible to provide a smooth surface of the front side 24.

On account of a nonlinear absorption effect, localized points within the semiconductor wafer 10 can be selectively processed by the laser beam 34, as a result of which it is possible to avoid damage to the front side 24 and the rear side 26 of the semiconductor wafer 10. The laser beam 34 and the semiconductor wafer 10 can be moved relative to one another in order to sense and process the semiconductor wafer 10 according to a desired division pattern, in particular along the scribe lines 14. In one example, the laser can be fixed and a chuck carrying the semiconductor wafer 10 can move relative to the fixed laser beam 34. The laser beam 34 can be applied at the predefined positions once or repeatedly at one or more depths of the semiconductor wafer 10. In this case, the term "depth" can refer to the shortest distance between the front side 24 of the semiconductor wafer 10 and that position in the semiconductor wafer 10 at which the laser beam 34 is focused. In this case, the number of laser beam applications and/or the chosen depths can depend in particular on the thickness of the semiconductor wafer 10 and/or the set power of the laser beam 34.

Applying the laser beam 34 can alter an (internal) material structure of the semiconductor wafer 10. In particular, the material structure can be altered both at the location at which the laser beam 34 was applied (or focused) and in adjoining regions. Before the laser beam 34 is applied to the semiconductor wafer 10, the semiconductor material can have a first crystalline structure, which can be substantially monocrystalline, for example. Applying the laser beam 34 can result in an increased temperature of up to thousands of degrees Celsius in the semiconductor material at the focus of the laser beam 34 and in adjoining regions. The semiconductor wafer 10 can be at least partly melted at these regions, which can result in destruction of the monocrystalline structure of the semiconductor wafer 10. After the laser beam 34 has been applied, the semiconductor wafer 10 can cool to the preceding temperature and in the process form a second material structure, which can be different from the first material structure. By way of example, the second material structure can be substantially of a polycrystalline type.

The laser beam 34 can be applied at regions 36 of the semiconductor wafer 10 at which one or more of the highly doped semiconductor material layers 20A, 20B were removed (cf. FIG. 2C). The highly doped semiconductor material of the semiconductor material layers 20A, 20B can be nontransparent to electromagnetic radiation in a wavelength range of the laser beam 34. By virtue of the highly doped semiconductor material being previously removed, coupling the laser radiation 34 into the semiconductor wafer 10 and thus the use of a stealth dicing process can thus be made possible in the first place. By contrast, applying the laser beam 34 to regions comprising highly doped semiconductor material can merely produce surface damage or melting of the highly doped material. In other words, focusing the laser beam 34 in the interior of the semiconductor wafer 10 would not be possible here. In contrast to conventional singulation processes, therefore, in the case of methods in accordance with the disclosure, stealth dicing processes can be employed for highly doped wafers.

After the stealth dicing process, in the interior of the semiconductor wafer 10 between the semiconductor chips 12 there can be one or more instances of damage to the semiconductor material in the form of stress cracks routed at points, which arose as a result of the laser beam 34 being applied. In particular, the instances of damage to the semiconductor wafer 10 can be present at different depths. An internal structure of the semiconductor wafer 10 resulting from the laser beam 34 being applied is shown and described in FIG. 4.

In the example in FIG. 2E, the semiconductor wafer 10 can be arranged on an elastic carrier 38. In further examples, the semiconductor wafer 10 can already have been arranged on the elastic carrier 38 at an earlier point in time. By way of example, the elastic carrier 38 can correspond to an elastic film or an elastic tape that can be laminated onto the rear side 26 of the semiconductor wafer 10. The semiconductor wafer 10 can subsequently be singulated into a plurality of MEMS semiconductor chips or MEMS components 200 by means of expanding the elastic carrier 38. For this purpose, the elastic carrier 38 can be expanded in directions indicated by arrows, with the result that the semiconductor chips 12 of the semiconductor wafer 10 are separated from one another at the locations of the instances of damage within the semiconductor material. The singulated MEMS semiconductor chips 200 can subsequently be removed from the carrier 38 by means of a pick-and-place process and optionally be processed by means of further method steps.

Figure 3:
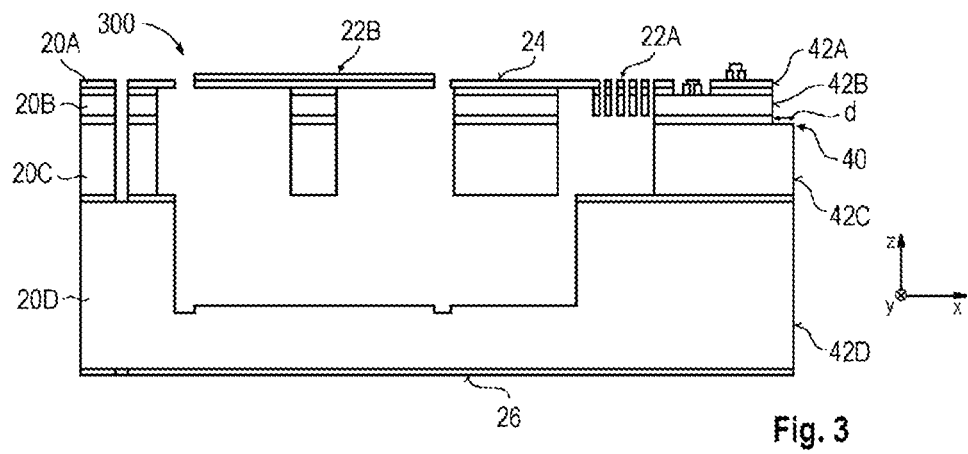
FIG. 3 shows a cross-sectional side view of a MEMS semiconductor chip 300 in accordance with the disclosure.

The MEMS semiconductor chip 300 in FIG. 3 can be fabricated for example in accordance with one of the methods in FIGS. 1 and 2A-2E. Explanations above concerning FIGS. 1 and 2A-2E can thus also apply to FIG. 3. In particular, the MEMS semiconductor chip 3 can be similar to one of the singulated MEMS semiconductor chips 200 in FIG. 2E.

The MEMS semiconductor chip 300 can have a first main surface or front side 24 and a second main surface or rear side 26. The MEMS semiconductor chip 300 can have one or more open (or not encapsulated or not hermetically encapsulated) MEMS structures 22A, 22B formed at the front side 24. Furthermore, the MEMS semiconductor chip 300 can have one or more highly doped semiconductor material layers 20A, 20B arranged at the front side 24 and one or more lightly doped semiconductor material layers 20C, 20D arranged underneath. A step 40 can be formed between the highly doped semiconductor material layers 20A, 20B and the lightly doped semiconductor material layers 20C, 20D.

The MEMS semiconductor chip 300 may have been singulated by means of an etching process and a stealth dicing process. Side surfaces 42A, 42B of the highly doped semiconductor material layers 20A, 20B can be processed by the etching process. One exemplary etching process is shown and described in FIG. 2C. The side surface 42A of the topmost semiconductor material layer 20A can adjoin the front side 24 of the MEMS semiconductor chip 300. Side surfaces 42C, 42D of the lightly doped semiconductor material layers 20C, 20D can be processed by the stealth dicing process. One exemplary stealth dicing process is shown and described in FIG. 2D. The side surface 42D of the bottommost semiconductor material layer 20D can adjoin the underside 26 of the MEMS semiconductor chip 300. In the example in FIG. 3, the step 40 can have a substantially rectangular course. It is clear that the course of the step 40 in further examples can also deviate slightly therefrom if manufacturing tolerances of the etching process and stealth dicing process applied are taken into account. On the basis of the step 40 it can be recognized that the MEMS semiconductor chip 300 can be produced on the basis of a method in accordance with the disclosure.

A dimension "d" of the step 40 in the x-direction can correspond for example to half a kerf width of a semiconductor wafer from which the MEMS semiconductor chip 300 was fabricated. Possible kerf widths of such a semiconductor wafer have already been described in connection with FIG. 2A-2E. Accordingly, the dimension "d" of the step 40 can be less than 120 micrometers, more precisely less than approximately 100 micrometers, and even more precisely less than approximately 80 micrometers. A ratio of the dimension "d" to a thickness of the MEMS semiconductor chip 300 in the z-direction can be less than approximately 0.2, more precisely less than approximately 0.15, and even more precisely less than approximately 0.1.

Figure 4:
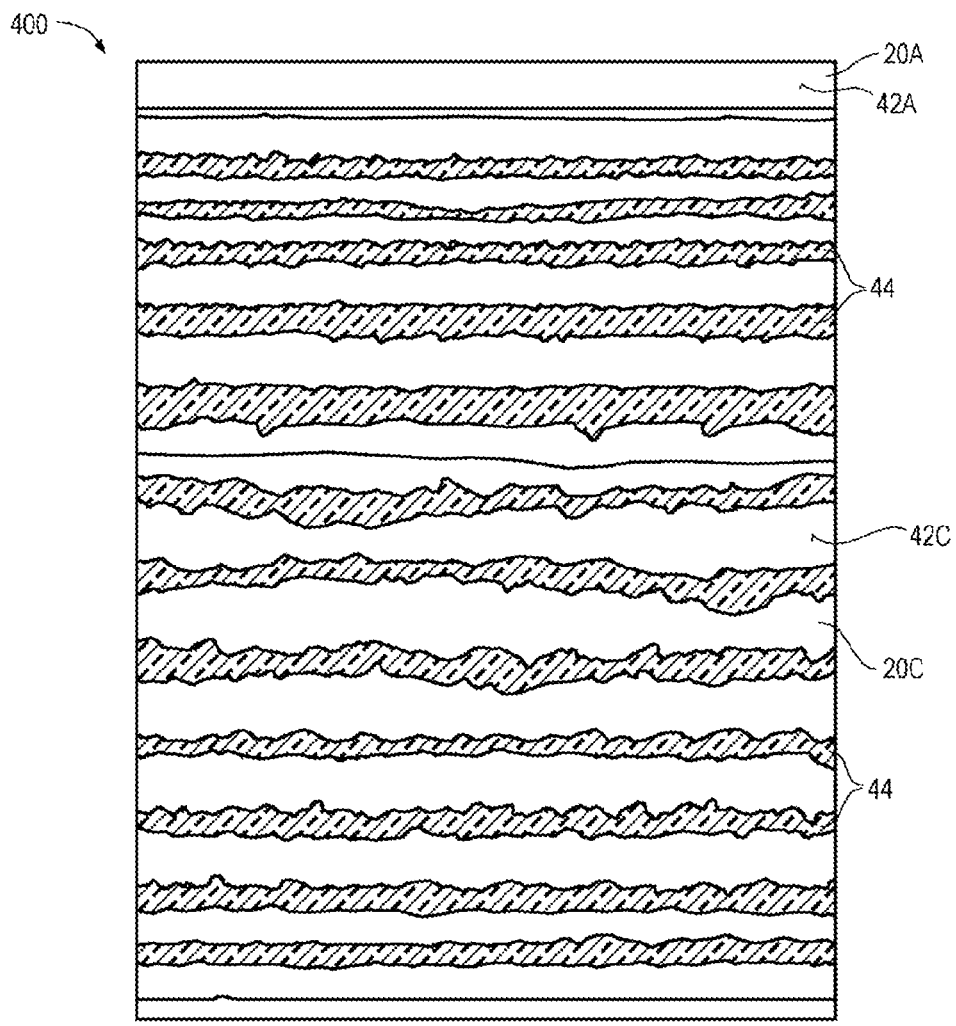
FIG. 4 shows a sidewall of a MEMS semiconductor chip 400 in accordance with the disclosure.

FIG. 4 shows a sidewall of a MEMS semiconductor chip 400, which can be similar to the MEMS semiconductor chip 300 in FIG. 3. A side surface 42A of a highly doped semiconductor material layer 20A can be processed by means of an etching process. Furthermore, a side surface 42C of a lightly doped semiconductor material layer 20C can be processed by means of a stealth dicing process. The etched side surface 42A can have a surface constitution which is characteristic of an etching process. In other words, on the basis of the surface constitution of the side surface 42A it can be recognized that the latter was produced by means of an etching process, in particular a plasma etching process. The underlying side surface 42C can have, at different depths, instances of damage or separations 44 of the semiconductor material, which may be produced by a stealth dicing process, as described in association with FIG. 2D. The side surface 42C can thus have a structure which is characteristic of a stealth dicing process.

Figure 5:
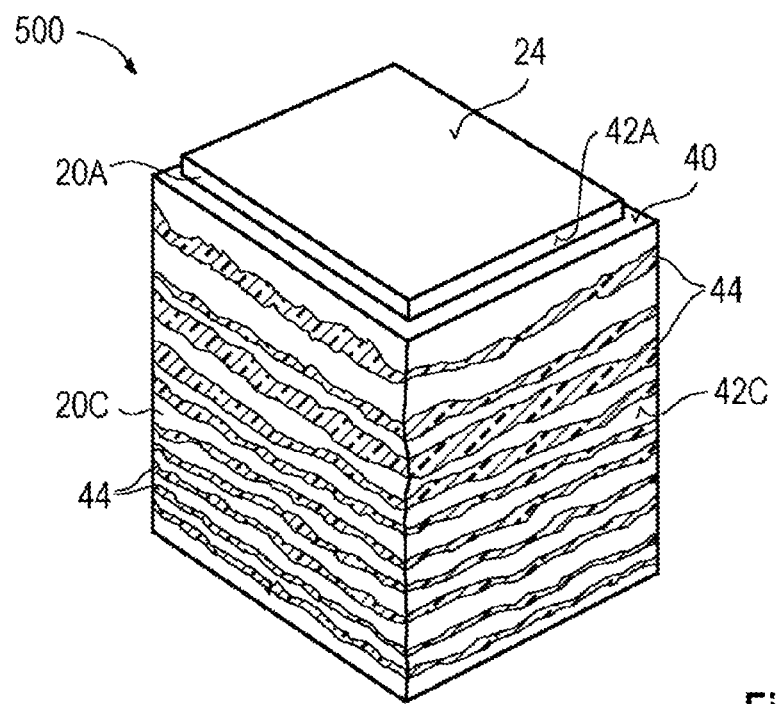
FIG. 5 shows a perspective view of a MEMS semiconductor chip 500 in accordance with the disclosure.

The MEMS semiconductor chip 500 in FIG. 5 can be similar to the MEMS semiconductor chips 300 and 400 in FIGS. 3 and 4, for example. Only one highly doped semiconductor material layer 20A and one lightly doped semiconductor material layer 20C are shown for the sake of simplicity in the example in FIG. 5. It is evident from FIG. 5 that a step 40, already described in association with FIG. 3, can extend at least partly along the edge of the front side 24 of the MEMS semiconductor chip 500. In FIG. 5, the step 40 can extend for example along the entire edge of the front side 24.

In the exemplary methods in FIGS. 1 and 2A-2E, highly doped semiconductor material layers were selectively removed at the front side of the semiconductor wafer before applying a stealth dicing process. Alternatively, or additionally, in further methods, a stealth dicing process can be applied from the rear side of the semiconductor wafer. In some such examples it is also possible to dispense with removing the highly doped layers. In the case of a rear-side stealth dicing process, the highly doped semiconductor material can be designed to provide a stop layer for the laser damage produced in the depth of the semiconductor material. Subsequent separation of the semiconductor wafer into the individual semiconductor chips can be effected in particular in the case of relatively thin highly doped layers. In this case, a thickness of the highly doped layers in the z-direction can be in a range of approximately 10 micrometers to approximately 60 micrometers.

EXAMPLES

MEMS semiconductor chips and methods for producing MEMS semiconductor chips are explained below on the basis of examples.

Example 1 is a method, comprising: producing a semiconductor wafer, comprising: a plurality of MEMS semiconductor chips, wherein the MEMS semiconductor chips have MEMS structures arranged at a first main surface of the semiconductor wafer, a first semiconductor material layer arranged at the first main surface, and a second semiconductor material layer arranged under the first semiconductor material layer, wherein a doping of the first semiconductor material layer is greater than a doping of the second semiconductor material layer; removing the first semiconductor material layer in a region between adjacent MEMS semiconductor chips; and applying a stealth dicing process from the first main surface of the semiconductor wafer and between the adjacent MEMS semiconductor chips.

Example 2 is a method according to example 1, wherein an electrical resistivity of the first semiconductor material layer is less than 0.01 $\Omega \cdot cm$.

Example 3 is a method according to example 1 or 2, wherein an electrical resistivity of the second semiconductor material layer is greater than 0.1 $\Omega \cdot cm$.

Example 4 is a method according to any of the preceding examples, wherein the first semiconductor material layer is nontransparent to electromagnetic radiation in a wavelength range of a laser used for the stealth dicing process.

Example 5 is a method according to any of the preceding examples, furthermore comprising: forming the MEMS structures by structuring the first semiconductor material layer, wherein structuring and removing the first semiconductor material layer are carried out simultaneously by means of an identical process technique.

Example 6 is a method according to any of the preceding examples, furthermore comprising: removing the first semiconductor material layer in an edge region of the first main surface of the semiconductor wafer, wherein removing the first semiconductor material layer in the edge region and between the adjacent MEMS semiconductor chips is carried out simultaneously by means of an identical process technique.

Example 7 is a method according to any of the preceding examples, wherein removing the first semiconductor material layer comprises one or more of dry etching or wet-chemical etching.

Example 8 is a method according to example 7, wherein the semiconductor wafer comprises an insulation layer arranged between the first semiconductor material layer and the second semiconductor material layer, said insulation layer being designed as an etch stop layer.

Example 9 is a method according to example 7 or 8, furthermore comprising: before applying the stealth dicing process, removing the insulation layer in the region between the adjacent MEMS semiconductor chips.

Example 10 is a method according to any of the preceding examples, wherein a ratio of a kerf width of the semiconductor wafer to a thickness of the semiconductor wafer is less than 0.4.

Example 11 is a method according to any of the preceding examples, wherein a ratio of a dimension of a metal-free region of the first main surface between the adjacent MEMS semiconductor chips to a kerf width of the semiconductor wafer is greater than 3.5.

Example 12 is a method according to any of the preceding examples, wherein a thickness of the semiconductor wafer in a direction perpendicular to the first main surface is greater than 600 micrometers.

Example 13 is a method according to any of the preceding examples, wherein a second main surface of the semiconductor wafer situated opposite the first main surface is closed in a continuous fashion.

Example 14 is a method according to any of the preceding examples, wherein the MEMS structures comprise movable micromirrors.

Example 15 is a MEMS semiconductor chip, comprising: a MEMS structure arranged at a first main surface of the MEMS semiconductor chip; a first semiconductor material layer arranged at the first main surface, and a second semiconductor material layer arranged under the first semiconductor material layer, wherein a doping of the first semiconductor material layer is greater than a doping of the second semiconductor material layer; and a step formed between the first semiconductor material layer and the second semiconductor material layer at a sidewall of the MEMS semiconductor chip.

Example 16 is a MEMS semiconductor chip according to example 15, wherein an electrical resistivity of the first semiconductor material layer is less than 0.01 Ω·cm.

Example 17 is a MEMS semiconductor chip according to example 15 or 16, wherein a side surface of the first semiconductor material layer is processed by means of an etching process.

Example 18 is a MEMS semiconductor chip according to any of examples 15 to 17, wherein a side surface of the second semiconductor material layer is processed by means of a stealth dicing process.

Example 19 is a MEMS semiconductor chip according to any of examples 15 to 18, wherein a ratio of a dimension of the step in a direction parallel to the first main surface to a thickness of the MEMS semiconductor chip is less than 0.2.

Example 20 is a MEMS semiconductor chip according to any of examples 15 to 19, wherein the step extends along the entire edge of the first main surface.

Example 21 is a MEMS semiconductor chip according to any of examples 15 to 20, wherein the MEMS structure comprises an open mirror structure.

Although specific embodiments have been illustrated and described herein, it is obvious to the person skilled in the art that a multiplicity of alternative and/or equivalent implementations can replace the specific embodiments shown and described, without deviating from the scope of the present disclosure. This application is intended to cover all adaptations or variations of the specific embodiments discussed herein. Therefore, the intention is for this disclosure to be restricted only by the claims and the equivalents thereof.

What is claimed is:

1. A method, comprising:
    producing a semiconductor wafer, the semiconductor wafer comprising:
        a plurality of microelectromechanical system (MEMS) semiconductor chips, wherein the plurality of MEMS semiconductor chips have MEMS structures arranged at a first main surface of the semiconductor wafer,
        a first semiconductor material layer arranged at the first main surface, and
        a second semiconductor material layer arranged under the first semiconductor material layer, wherein a doping of the first semiconductor material layer is greater than a doping of the second semiconductor material layer;
    removing the first semiconductor material layer in a region between adjacent MEMS semiconductor chips; and
    applying a stealth dicing process from the first main surface of the semiconductor wafer and between the adjacent MEMS semiconductor chips.

2. The method as claimed in claim 1, wherein an electrical resistivity of the first semiconductor material layer is less than 0.01 Ω·cm.

3. The method as claimed in claim 2, wherein an electrical resistivity of the second semiconductor material layer is greater than 0.1 Ω·cm.

4. The method as claimed in claim 1, wherein the first semiconductor material layer is nontransparent to electromagnetic radiation in a wavelength range of a laser used for the stealth dicing process.

5. The method as claimed in claim 1, further comprising:
    forming the MEMS structures by structuring the first semiconductor material layer, wherein structuring and removing the first semiconductor material layer are carried out simultaneously by means of an identical process technique.

6. The method as claimed in claim 1, further comprising:
    removing the first semiconductor material layer in an edge region of the first main surface of the semiconductor wafer, wherein removing the first semiconductor material layer in the edge region and between the adjacent MEMS semiconductor chips is carried out simultaneously by means of an identical process technique.

7. The method as claimed in claim 1, wherein removing the first semiconductor material layer comprises one or more of dry etching or wet-chemical etching.

8. The method as claimed in claim 7, wherein the semiconductor wafer comprises an insulation layer arranged between the first semiconductor material layer and the second semiconductor material layer, the insulation layer being designed as an etch stop layer.

9. The method as claimed in claim 8, further comprising:
    before applying the stealth dicing process, removing the insulation layer in the region between the adjacent MEMS semiconductor chips.

10. The method as claimed in claim 1, wherein a ratio of a kerf width of the semiconductor wafer to a thickness of the semiconductor wafer is less than 0.4.

11. The method as claimed in claim 1, wherein a ratio of a dimension of a metal-free region of the first main surface between the adjacent MEMS semiconductor chips to a kerf width of the semiconductor wafer is greater than 3.5.

12. The method as claimed in claim 1, wherein a thickness of the semiconductor wafer in a direction perpendicular to the first main surface is greater than 600 micrometers.

13. The method as claimed in claim 1, wherein a second main surface of the semiconductor wafer situated opposite the first main surface is closed in a continuous fashion.

14. The method as claimed in claim 1, wherein the MEMS structures comprise movable micromirrors.

* * * * *